United States Patent [19]
Bornstein et al.

[11] Patent Number: 5,540,789
[45] Date of Patent: Jul. 30, 1996

[54] OXIDATION RESISTANT SINGLE CRYSTAL SUPERALLOY CASTINGS

[75] Inventors: Norman S. Bornstein, West Hartford; Stephen Chin, Wallingford; David N. Duhl, Newington; Donald R. Parille, South Windsor; Dilip M. Shah, Glastonbury, all of Conn.

[73] Assignee: United Technologies Corporation, Hartford, Conn.

[21] Appl. No.: 389,434

[22] Filed: Feb. 15, 1995

Related U.S. Application Data

[63] Continuation of Ser. No. 167,605, Dec. 14, 1993, abandoned, which is a continuation of Ser. No. 889,581, May 28, 1992, abandoned.

[51] Int. Cl.$^6$ ............................................. C22C 19/03
[52] U.S. Cl. .................. 148/404; 148/410; 148/428; 420/443
[58] Field of Search ............................ 148/404, 410, 148/428; 420/443

[56] References Cited

U.S. PATENT DOCUMENTS

| | | | |
|---|---|---|---|
| 3,146,136 | 8/1964 | Bird et al. | 148/410 |
| 3,166,412 | 1/1965 | Bieber | 420/443 |
| 3,859,060 | 1/1975 | Eiselstein et al. | 420/445 |
| 4,209,348 | 6/1980 | Duhl et al. | 148/410 |
| 4,719,080 | 1/1988 | Duhl et al. | 420/443 |
| 5,069,873 | 12/1991 | Harris et al. | 420/448 |
| 5,335,717 | 8/1994 | Chin et al. | 164/519 |

FOREIGN PATENT DOCUMENTS

| | | |
|---|---|---|
| 032812 | 7/1981 | European Pat. Off. . |
| 0155827 | 9/1985 | European Pat. Off. . |
| 0246082 | 11/1987 | European Pat. Off. . |
| 413439 | 2/1991 | European Pat. Off. . |
| 052911 | 6/1982 | Japan . |

OTHER PUBLICATIONS

Superalloys, edited by C. T. Sims et al: p. 293 1987.
The Making, Shaping and Treating of Steel, edited by H. E. McGannon; pp. 365 and 587 1975.

Primary Examiner—Deborah Yee

[57] ABSTRACT

Single crystal superalloy castings are described which have excellent oxidation resistance. The oxidation resistance is due to the presence of small but effective amounts of magnesium in the casting. Single crystal castings containing magnesium in the range of 5–200 parts per million, by weight, are described.

13 Claims, 2 Drawing Sheets

OXIDATION RESISTANT SINGLE CRYSTAL SUPERALLOY CASTINGS

This is a continuation of Ser. No. 08/167,605, filed on Dec. 14,1993 (now abandoned) which is a continuation of Ser. No. 07/889/581, filed on May 28, 1992 (now abandoned).

TECHNICAL FIELD

This invention relates to single crystal castings having excellent oxidation resistance.

BACKGROUND ART

Materials used in the high temperature sections of modern gas turbine engines and other similar machines require an optimized combination of several properties, including mechanical properties as well as resistance to environmental degradation (oxidation and corrosion). Superalloys, based on nickel, cobalt, or iron, often possess these desired properties and have found widespread use in industry. The term superalloys is used to denote the class of refractory modified nickel, cobalt or iron based metal alloys specifically developed for high temperature service. Generally speaking, superalloys with the highest temperature capability have a single crystal microstructure. In other words, the casting is of a single grain, and has no internal grain boundaries. Single crystal castings are described in U.S. Pat. No. 4,209,348 to Duhl et al., the contents of which are incorporated herein by reference. The Duhl et al. patent describes a single crystal superalloy casting having excellent mechanical properties and oxidation resistance.

Many superalloys owe their oxidation resistance to their ability to form a protective oxide film on the casting surface during use at elevated temperatures. The oxide film must be adherent in order for it to provide long term oxidation resistance. The most protective films are generally considered to be aluminum oxide.

The element sulfur has been shown to detrimentally affect the ability of oxide films to adhere to the casting surface. Accordingly, a significant effort has been directed into removing sulfur from the casting or immobilizing sulfur in the casting. However, the prior art methods for addressing the sulfur problem have not been entirely successful. Accordingly, what is still needed in the superalloy industry is a method for dealing with sulfur and for making single crystal superalloy castings having the required levels of mechanical strength and oxidation resistance.

SUMMARY OF THE INVENTION

This invention relates to the discovery that the single crystal nickel base superalloy castings containing small amounts of magnesium have excellent oxidation resistance. Single crystal castings according to this invention consist essentially of, by weight percent, 1–12 chromium, 2–12 cobalt, 0–2.5 molybdenum, 3–10 tungsten, 0–8 rhenium, 2.5–13 tantalum, 0–2 titanium, 4.5–6.5 aluminum, 0–0.5 hafnium, 0–0.1 carbon, 5–200 parts per million magnesium, balance nickel.

A specific composition within the most preferred range of compositions consists essentially of, by weight percent, 4.75–5.25 chromium, 9.5–10.5 cobalt, 5.6–6.2 tungsten, 8.4–9 tantalum, 5.5–5.8 aluminum, 1.7–2.1 molybdenum, 2.8–3.2 rhenium, 0.05–0.15 hafnium, 0–0.025 carbon, 0.001–0.007 magnesium, remainder nickel.

Single crystal castings in accordance with this invention have significantly improved oxidation resistance compared to prior art castings, and in particular, compared to castings having a similar composition but lacking magnesium.

These and other features of the present invention will become apparent in light of the following description of the best mode for carrying out the invention, and the drawings.

BEST MODE FOR CARRYING OUT THE INVENTION

Castings in accordance with the invention are made in the following manner. Master melts consisting essentially of, by weight percent, 1–12 chromium, 2–12 cobalt, 0–2.5 molybdenum, 3–10 tungsten, 0–8 rhenium, 2.5–13 tantalum, 0–2 titanium, 4.5–6.5 aluminum, 0–0.5 hafnium, 0–0.1 carbon, balance nickel are made. The master melt is then processed to produce single crystal castings using standard single crystal casting techniques, except for the fact that the casting molds are slightly modified from conventional practice. In particular, the casting molds are modified such that magnesium is intentionally introduced into the molten metal alloy while it solidifies in the mold. The molds are specifically modified such that 5–200 parts per million of magnesium are introduced into the casting as a result of a controlled reaction of the molten alloy with a magnesium bearing ceramic material in the mold.

Figure 1:
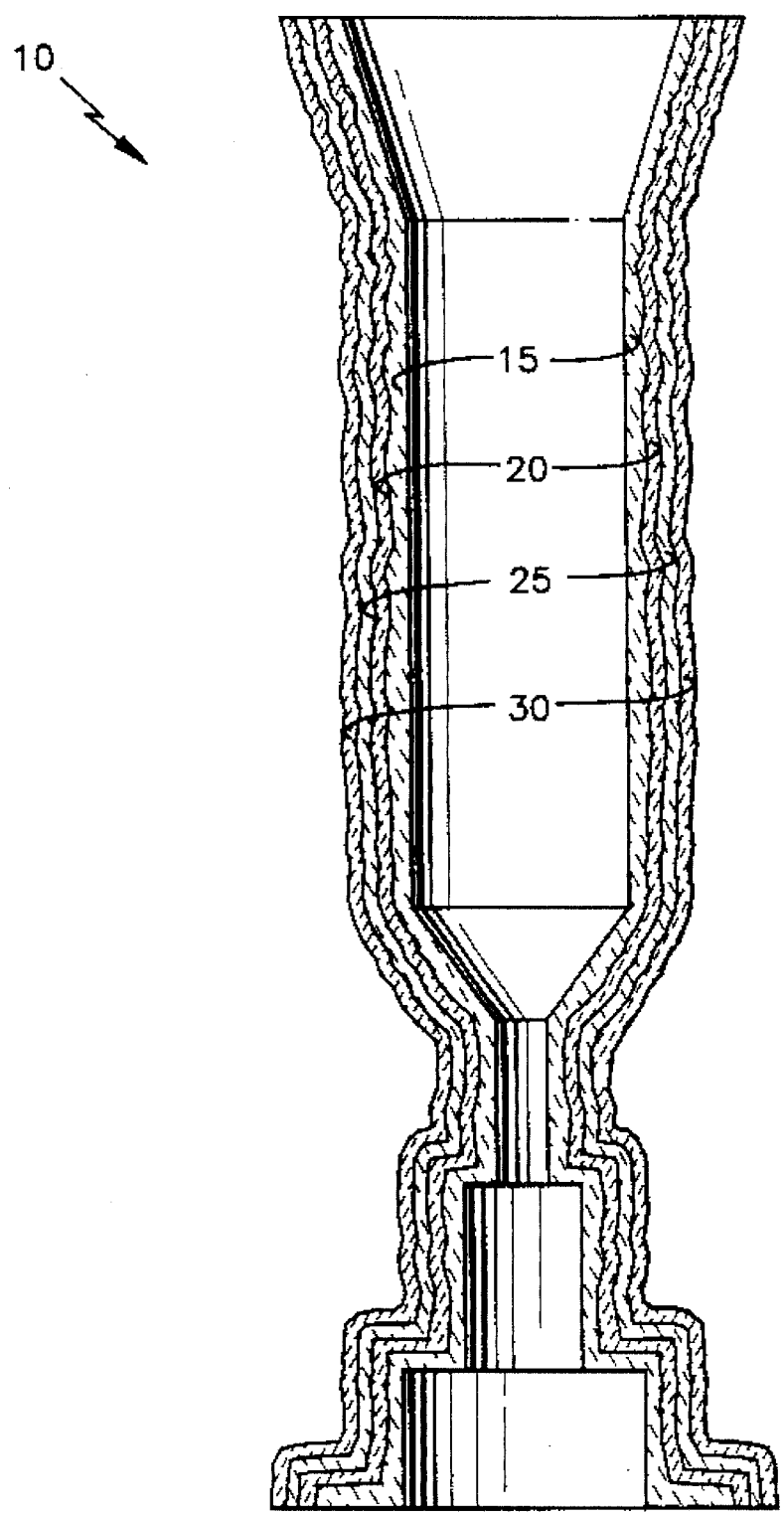
FIG. 1 is a schematic cross sectional view of a casting mold useful in making components in accordance with this invention.

FIG. 1 illustrates a casting shell mold 10 useful in carrying out the invention. The mold is made from a fugitive pattern (not shown), such as a wax pattern, that is alternately dipped in a ceramic slurry, stuccoed with ceramic particles and then dried in repeated fashion to build a shell mold about the pattern. The combination of the first layer of slurry and the first layer of stucco produces a face coat 15. The face coat 15 is backed by additional zircon and or alumina containing layers of slurry and stucco 25, 30, respectively, in a manner typical of shell mold production. (Even though FIG. 1 shows only two backup layers 25, 30, several more backup layers may be used, depending on the specific casting process utilized and the design of the desired casting.) The mold of this invention utilizes a magnesium bearing ceramic material, such as magnesia, in face coat 15. Between the backup layers 25, 30 and the face coat layer 15 is a barrier layer 20 comprised of alumina.

Figure 2:
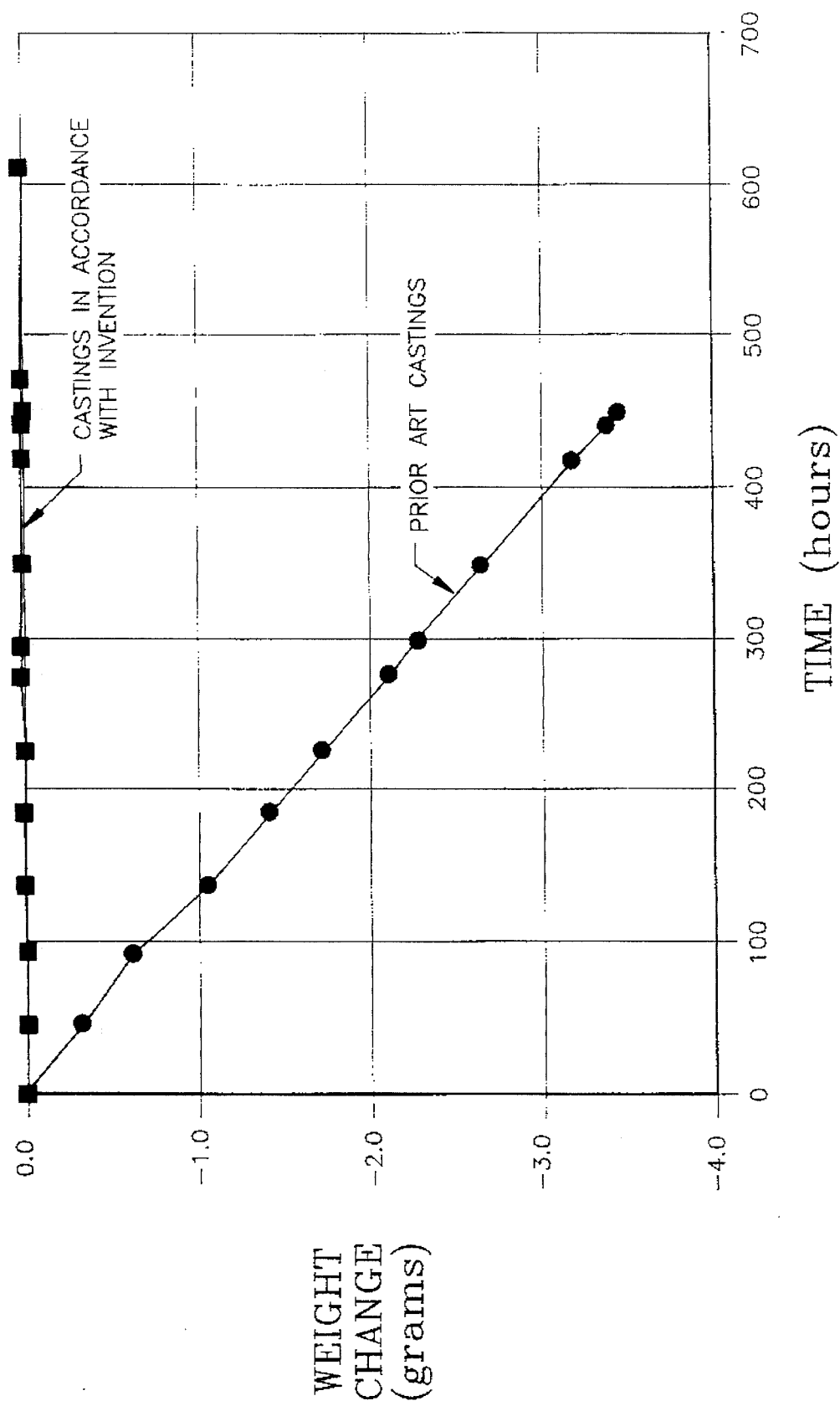
FIG. 2 is a graph which shows the oxidation resistance of single crystal castings in accordance with this invention, as compared to castings which are not in accordance with the invention.

During the casting process, while molten metal is solidifying within the mold 10, the magnesium bearing material in the face coat 15 undergoes a reduction reaction to produce magnesium, which combines with the metal alloy in the mold. Tests have shown that such enrichment of the alloy with magnesium has a significant effect on the oxidation resistance of the resultant single crystal castings, as shown in FIG. 2. The samples whose performance are shown in FIG. 2 were tested in conventional cyclic oxidation tests at 1,150° C. (2,100° F.). One set of samples was cast into a mold intentionally containing magnesium bearing materials (in the form of a magnesia bearing face coat); the other set of samples of like composition was cast into a mold which did not intentionally contain any magnesium bearing materials. The performance of the latter group of samples is considered typical of the prior art. It is apparent from FIG. 2 that the single crystal castings of this invention have markedly superior oxidation resistance compared to the prior art specimens.

The following table sets forth the composition ranges of nickel base superalloy castings in accordance with this invention.

| Element | Composition Range (Weight Percent) | | |
|---|---|---|---|
| | Broad | Preferred | Most Preferred |
| Chromium | 1–12 | 3.5–11.5 | 3.75–6.25 |
| Cobalt | 2–12 | 3.5–11.5 | 8.5–11.5 |
| Molybdenum | 0–2.5 | 0–2.5 | 0.7–2.5 |
| Tungsten | 3–10 | 3–7.2 | 4.6–7.2 |
| Rhenium | 0–8 | 0–4.2 | 1.8–4.2 |
| Tantalum | 2.5–13 | 7.4–13 | 7.4–10 |
| Titanium | 0–2 | 0–2 | 0 |
| Aluminum | 4.5–6.5 | 4.5–6.5 | 4.5–6.5 |
| Hafnium | 0–0.5 | 0–0.25 | 0.01–0.25 |
| Carbon | 0–0.1 | 0–0.05 | 0–0.025 |
| Magnesium | 0.0005–0.0200 | 0.0010–0.0100 | 0.0010–0.0070 |
| Nickel | Remainder | Remainder | Remainder |

A specific composition within the most preferred range of compositions is as follows: 4.75–5.25 chromium, 9.5–10.5 cobalt, 5.6–6.2 tungsten, 8.4–9.0 tantalum, 5.5–5.8 aluminum, 1.7–2.1 molybdenum, 2.8–3.2 rhenium, 0.05–0.15 hafnium, 0–0.025 carbon, 0.001–0.007 magnesium, remainder nickel. Single crystal castings having such composition have exhibited excellent oxidation resistance in conditions which simulate the turbine section of advanced gas turbine engines.

The best improvements in oxidation resistance are achieved when the single crystal castings contain magnesium in the range of 0.0005–0.0200 weight percent; however, additions of calcium will also improve oxidation resistance. In particular, additions of calcium in an amount, by atomic percent, equivalent to 0.0005–0.0200 weight percent magnesium, are useful. Alternatively, up to 100% of the magnesium may be substituted for by an equal atomic percent of calcium.

While additions of magnesium to the casting is best accomplished through the use of a magnesium bearing mold system, as described above it may also be accomplished by intentional additions of magnesium to the master melt. In order to make single crystal castings in this manner, the casting process needs to be modified so as to prevent excessive loss of such magnesium in the single crystal casting process, to retain 0.0005–0.0200 percent magnesium in the finished single crystal casting.

Although this invention has been shown and described with respect to detailed embodiments thereof, it will be understood by those skilled in the art that various changes in form and detail thereof may be made without departing from the spirit and scope of the claimed invention.

We claim:

1. A single crystal nickel base superalloy casting with improved oxidation resistance, the casting consisting essentially of, by weight percent, 1–12 chromium, 2–12 cobalt, 0–2.5 molybdenum, 3–10 tungsten, 0–8 rhenium, 2.5–13 tantalum, 0–2 titanium, 4.5–6.5 aluminum, 0–0.5 hafnium, 0–0.1 carbon, 0.0005–0.0200 total amount of at least one element selected from the group consisting of magnesium and calcium, remainder nickel, wherein at least one element selected from the group consisting of magnesium and calcium is added for improved oxidation resistance.

2. The single crystal nickel base superalloy casting of claim 1 wherein the element is magnesium.

3. The single crystal nickel base superalloy casting of claim 1 wherein the element is calcium.

4. A single crystal nickel base superalloy casting with improved oxidation resistance, the casting consisting essentially of, by weight percent, 3.5–11.5 chromium, 3.5–11.5 cobalt, 0–2.5 molybdenum, 3–7.2 tungsten, 0–4.2 rhenium, 7.4–13 tantalum, 0–2 titanium, 4.5–6.5 aluminum, 0–0.25 hafnium, 0–0.05 carbon, 0.0010–0.0100 total amount of at least one element selected from the group consisting of magnesium and calcium, remainder nickel, wherein at least one element selected from the group consisting of magnesium and calcium is added for improved oxidation resistance.

5. The single crystal nickel base superalloy casting of claim 4 wherein the element is magnesium.

6. The single crystal nickel base superalloy casting of claim 4 wherein the element is calcium.

7. A single crystal nickel base superalloy casting with improved oxidation resistance, the casting consisting essentially of, by weight percent, 3.75–6.25 chromium, 8.5–11.5 cobalt, 0.7–2.5 molybdenum, 4.6–7.2 tungsten, 1.8–4.2 rhenium, 7.4–10 tantalum, 4.5–6.5 aluminum, 0.01–0.25 hafnium, 0–0.025 carbon, 0.00250–0.0070 total amount of at least one element selected from the group consisting of magnesium and calcium, remainder nickel, wherein at least one element selected from the group consisting of magnesium and calcium is added for improved oxidation resistance.

8. The single crystal nickel base superalloy casting of claim 7 wherein the element is magnesium.

9. The single crystal nickel base superalloy casting of claim 7 wherein the element is calcium.

10. A single crystal nickel base superalloy casting with improved oxidation resistance, the casting consisting essentially of, by weight percent, 4.75–5.25 chromium, 9.5–10.5 cobalt, 5.6–6.2 tungsten, 8.4–9.0 tantalum, 5.5–5.8 aluminum, 1.7–2.1 molybdenum, 2.8–3.2 rhenium, 0.05–0.15 hafnium, 0–0.025 carbon, 0.001–0.0070 total amount of at least one element selected from the group consisting of magnesium and calcium, remainder nickel, wherein at least one element selected from the group consisting of magnesium and calcium is added for improved oxidation resistance.

11. The single crystal nickel base superalloy casting of claim 10 wherein the element is magnesium.

12. The single crystal nickel base superalloy casting of claim 10 wherein the element is calcium.

13. A single crystal nickel base superalloy casting with improved oxidation resistance, the casting consisting essentially of, by weight percent, 1–12 chromium, 2–12 cobalt, 0–2.5 molybdenum, 3–10 tungsten, 0–8 rhenium, 2.5–13 tantalum, 0–2 titanium, 4.5–6.5 aluminum, 0–0.5 hafnium, 0–0.1 carbon, 0.0005–0.0200 total amount of magnesium and calcium, remainder nickel, wherein magnesium and calcium are added for improved oxidation resistance.

* * * * *